Oct. 4, 1966 D. P. TRILLER 3,276,423

PATTERN MASK FOR USE IN MAKING THIN FILM CIRCUITRY

Filed Oct. 4, 1963

INVENTOR.
David P. Triller,
BY H. H. Losche
Paul S. Collignon
Att'y.

3,276,423
PATTERN MASK FOR USE IN MAKING THIN FILM CIRCUITRY

David P. Triller, Indianapolis, Ind., assignor to the United States of America as represented by the Secretary of the Navy Filed Oct. 4, 1963, Ser. No. 314,078
2 Claims. (Cl. 118—504)

The invention described herein may be manufactured and used by or for the Government of the United States of America for governmental purposes without the payment of any royalties thereon or therefor.

The present invention relates to pattern masks that are to be used in making thin-film circuitry and more particularly to very thin masks that are to be used at elevated temperatures.

There is a constant demand for smaller electrical and electronic components, particularly in the aircraft and missile fields, as weight is of extreme importance. One concept of microelectronics which offers a great reduction in size and weight of electronic units is that of integrated circuitry which is formed on insulated bases. Integrated circuitry includes a number of active and passive components which are fabricated by one or more of a combination of several thin-film deposition techniques onto a substrate.

The substrate can be of any suitable material, such as glass, alumina, beryllia, or barium titanate. The present state of the art of thin-film microcircuitry fabrication permits the deposition of resistors, capacitors, small inductances, and connectors. This solid film can be deposited onto substrates by various methods such as electrodeposition, chemical precipitation, thermal decomposition, cathodic sputtering and high vacuum evaporation. The depositing of films by high vacuum evaporation has been particularly successful as the process is easily controlled, and the deposited films have a high degree of purity.

The capacitance of a thin-film condenser is a function of the areas of the capacitor electrodes. The resistance of a thin-film resistor is a function of the resistor length and width. The interconnection of microcircuit components requires the deposition of conducting materials on accurately located areas of the substrate. It can thus be seen that the successful production of passive thin-film microcircuitry is largely dependent upon the ability to deposit desired materials at accurately defined areas on a substrate.

As the size of the areas of the active and passive components which are deposited on the substrates must be very exact, the design of the mask that governs the pattern of the components is critical. Heretofore, one well-known type of mask employed in the making of integrated circuitry components consisted of a very thin metallic plate which has been pierced or etched to provide a plurality of apertures of desired configuration. One such mask is shown and described in U.S. Patent 3,061,476, entitled "Method of Making Thermistor Bolometers," which was issued October 30, 1962, to Henry F. Miserocchi. The mask described in the Miserocchi patent has a thickness between 10 and 100 microns and is formed of metal or a plastic material such as "Mylar." In operation, the thin mask is secured to a backing block by a gripping bar and a pair of C-clamps.

Heretofore very thin metallic masks such as the one described in the above-mentioned patent were limited to low temperature enviornment as high temperatures would buckle and distort the thin masks and thus make them unsuitable for precision work. In the present invention, the mask is assembled such that it can expand and contract in the horizontal plane but has its vertical movement restricted so that there cannot be any buckling or warping.

A plurality of holes are provided around the periphery of the thin metallic mask and these holes fit around a plurality of buttons that are provided on a metal support plate. The diameter of each button is substantially smaller than the diameter of each hole and thus may permit relative movement between the mask and support plate. A second set of buttons, equal in number to the first set, but substantially larger than the diameter of the holes, are then secured, as by welding, one each to the buttons that are provided on the metal support plate.

It is therefore a general object of the present invention to provide an improved masking device for use in depositing thin films onto substrates.

Another object of the present invention is to provide a masking device that will not distort or buckle when subjected to elevated temperatures.

Other objects and advantages of the present invention will be readily appreciated as the same becomes better understood by reference to the following detailed description when considered in connection with the accompanying drawing wherein.

Figure 1:
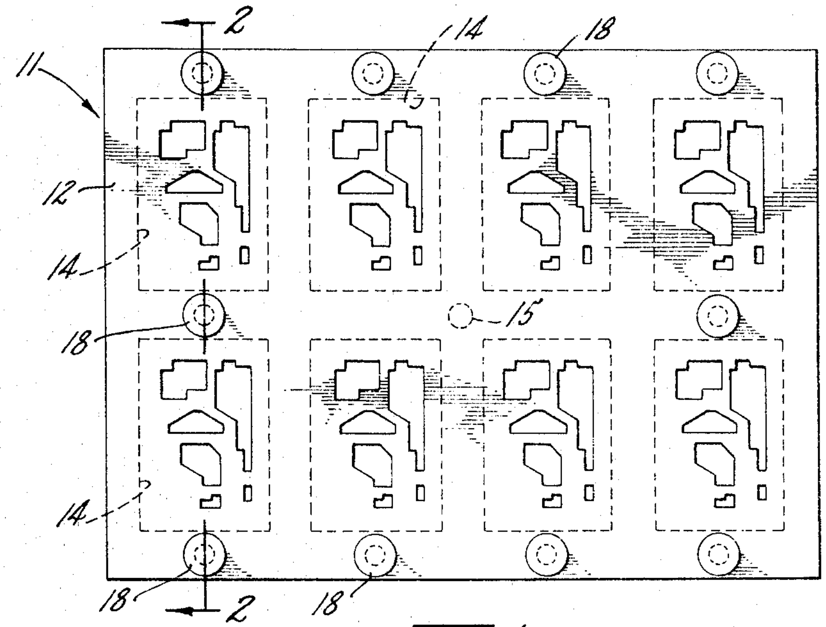
FIGURE 1 is a top plan view showing a preferred embodiment of the present invention.
Figure 2:
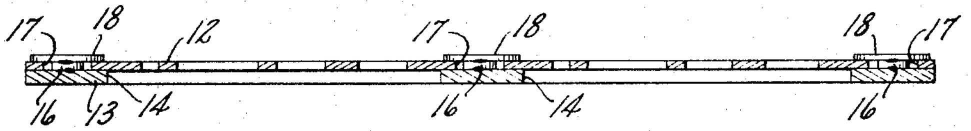
FIGURE 2 is a sectional view taken on line 2—2 of FIGURE 1.

Referring now to the drawing, there is shown a mask assembly 11 that is comprised of a mask 12 and a support plate 13. By way of example, the mask 12 is shown having eight identical patterns, with each pattern being positioned over a rectangular opening 14 in support of plate 13. Mask 12 is attached, as by cementing or welding, to support plate 13 at a single center point 15.

A plurality of buttons 16 are attached, as by cementing or welding, to support plate 13, and a plurality of holes 17, equal in number to the number of buttons 16 are provided in mask 12. The diameter of each hole 17 is larger than the diameter of each button 16 and the buttons and holes are spaced such that a button 16 is centered in each hole 17. The thickness of each button 16 is substantially equal to the thickness of mask 12.

A second set of buttons 18, equal in number to the number of buttons 16, are provided and a button 18 is attached, as by cementing or welding, to each button 16. The diameter of each button 18 is larger than the diameter of holes 17 and with buttons 18 being attached to buttons 16, mask 12 is firmly held against support plate 13. However, as holes 17 are larger than buttons 16, expansion due to temperature changes is possible, yet buckling or warping is prevented.

Figure 3:
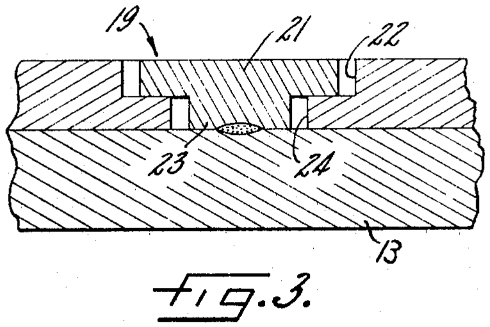
FIGURE 3 is an enlarged sectional view showing a flush-type arrangement of a hold-down button.

In FIGURE 3 of the drawing there is shown an embodiment of the invention wherein one button 19 is used instead of the two buttons 16 and 18. Button 19 is provided with a head 21 and mask 12 is provided with a plurality of counterbored holes 22 that accommodate button 19 when it is attached, as by cementing or welding, to support plate 13. Head 21 is smaller in diameter than the diameter of the counterbore and the diameter of shank 23 is smaller than the diameter of hole 24.

In operation, the mask assembly 11 is positioned inside a deposition chamber with mask 12 being in contact with the substrates that are to be processed. The substrates are normally heated between 100–300 degrees C., depending upon the material being deposited, and consequently, the masks reach the temperature of the substrates. As there can be sliding movement between mask 12 and support plate 13, expansion and contraction of mask 12 can take place without any resulting buckling or warping.

It can thus be seen that the present invention provides an improved mask assembly for use in depositing thin-film circuitry and that the mask will not distort or buckle when subjected to elevated temperatures.

Obviously many modifications and variations of the present invention are possible in the light of the above teachings. It is therefore to be understood, that within the scope of the appended claims, the invention may be practiced otherwise than as specifically described.

What is claimed is:

1. A thin film pattern mask assembly comprising, a support plate;

a thin mask having a plurality of aperture patterns therein and a plurality of holes around the periphery thereof; said mask being fixedly attached to said support plate at a single center point;

means attached to said support plate for preventing buckling of said thin mask when subjected to elevated temperature; said means including a first plurality of buttons; each of said buttons protruding through, and being of substantially smaller diameter than, a separate one of said holes; a second plurality of buttons attached one each to each of said first buttons; the diameter of each of said second buttons being greater than that of each said hole with which it is associated; and said first buttons being of a length substantially equal to the thickness of said mask but of such extent that the second buttons inhibit any travel of the mask along the axial extent of said first named buttons and do not inhibit planar movement of said mask due to thermal effects.

2. The assembly of claim 1 further characterized in that said second buttons are each disposed in a recessed portion of the mask surface remote from said support plate; and said second recessed portion is of a diameter larger than said second buttons so as to not inhibit said planar movement of the mask.

References Cited by the Examiner

UNITED STATES PATENTS

| | | | |
|---|---|---|---|
| 2,099,364 | 11/1937 | Hunter | 101—426 |
| 2,239,770 | 4/1941 | Becker et al. | |
| 2,286,819 | 6/1942 | Lee | 118—49 |
| 2,399,975 | 5/1946 | Ball | 101—426 |
| 2,626,858 | 1/1953 | McGraw et al. | 101—426 |
| 2,969,296 | 1/1961 | Walsh | 117—106 X |
| 3,000,737 | 9/1961 | Barnhart | 101—426 |
| 3,207,126 | 9/1965 | Byron | 118—49 |

MORRIS KAPLAN, *Primary Examiner.*